United States Patent
Wu et al.

(10) Patent No.: US 10,958,252 B2
(45) Date of Patent: Mar. 23, 2021

(54) MULTI-BIT FLIP-FLOP AND ELECTRONIC DEVICE

(71) Applicant: DIGWISE TECHNOLOGY CORPORATION, LTD, Hsinchu County (TW)

(72) Inventors: Jingjie Wu, Beijing (CN); Chih-Wen Yang, Hsinchu County (TW); Wen-Pin Hsieh, Hsinchu County (TW)

(73) Assignee: DIGWISE TECHNOLOGY CORPORATION, LTD, Hsinchu County (TW)

( * ) Notice: Subject to any disclaimer, the term of this patent is extended or adjusted under 35 U.S.C. 154(b) by 0 days.

(21) Appl. No.: 16/626,894

(22) PCT Filed: Jul. 4, 2018

(86) PCT No.: PCT/CN2018/000242
§ 371 (c)(1),
(2) Date: Dec. 27, 2019

(87) PCT Pub. No.: WO2020/006649
PCT Pub. Date: Jan. 9, 2020

(65) Prior Publication Data
US 2021/0058074 A1   Feb. 25, 2021

(51) Int. Cl.
*H03K 3/037*   (2006.01)
(52) U.S. Cl.
CPC ................ *H03K 3/037* (2013.01)

(58) Field of Classification Search
CPC ........................................ H03K 3/037
USPC ................................. 327/215–222
See application file for complete search history.

(56) References Cited

U.S. PATENT DOCUMENTS

| | | | |
|---|---|---|---|
| 6,400,206 B2* | 6/2002 | Kim ............. | H03K 3/356113 326/68 |
| 6,864,733 B2* | 3/2005 | Anshumali ...... | H03K 3/356156 327/210 |
| 2010/0176860 A1* | 7/2010 | Chen ............. | H03K 3/356121 327/218 |

FOREIGN PATENT DOCUMENTS

CN          108156714 A  *  6/2018

* cited by examiner

*Primary Examiner* — Tomi Skibinski

(57) ABSTRACT

An embodiment of the invention provides a multi-bit flip-flop. The multi-bit flip-flop includes a clock input pin, a clock buffer circuit, and a plurality of flip-flops. The clock buffer circuit is used to receive a first clock signal received from the clock input pin and provide a second clock signal and a third clock signal according to the first clock signal. Each of the plurality of flip-flops is used to receive the second clock signal and the third clock signal and store data according to the second clock signal and the third clock signal. Therefore, the multi-bit flip-flop is designed such that makes each of the plurality of flip-flops to share the same clock.

34 Claims, 9 Drawing Sheets

MULTI-BIT FLIP-FLOP AND ELECTRONIC DEVICE

FIELD OF THE INVENTION

The present invention relates to a flip-flop (FF), and more particularly to a multi-bit flip-flop and an electronic device capable of sharing a clock.

BACKGROUND OF THE INVENTION

A flip-flop only can store a bit of data. When it wants to store multi bit of data, it must combine several flip-flops for use, which are collectively called a "multi-bit flip-flop". Since a clock path is one of the most complicated parts of the overall circuit design in the current multi-bit flip-flop, how to improve the clock path of the multi-bit flip-flop and effectively reduce the clock amplitude is an important issue in the art.

SUMMARY OF THE INVENTION

An embodiment of the present invention provides a multi-bit flip-flop. The multi-bit flip-flop includes a clock input pin, a clock buffer circuit, and a plurality of flip-flops. The clock input pin is configured to receive a first clock signal. The clock buffer circuit is coupled to the clock input pin, and used to receive the first clock signal, and provide a second clock signal and a third clock signal according to the first clock signal, wherein the clock buffer circuit includes a first inverter and a second inverter. The first inverter is coupled to the clock input pin via a first node, and used to receive and invert the first clock signal and output an inverted first clock signal as the second clock signal via a second node. The second inverter is coupled to the second node via a third node, and used to receive and invert the second clock signal and output an inverted second clock signal as the third clock signal via a fourth node. Each of the plurality of flip-flops has a data input end and a data output end corresponding to each other, and each of the plurality of flip-flops is coupled to the third node and the fourth node, and used to receive the second clock signal and the third clock signal and stores data according to the second clock signal and the third clock signal.

An embodiment of the present invention provides another multi-bit flip-flop. The multi-bit flip-flop includes a clock input pin, a clock buffer circuit, and a plurality of flip-flops. The clock input pin is configured to receive a first clock signal. The clock buffer circuit is coupled to the clock input pin, and used to receive the first clock signal and provide a second clock signal and a third clock signal according to the first clock signal, wherein the clock buffer circuit includes a first inverter, a second inverter, and a transistor string. The first inverter is coupled to the clock input pin via a first node, and used to receive and invert the first clock signal and output an inverted first clock signal as a fourth clock signal via a second node. The second inverter is coupled to the second node via a third node, and used to receive and invert the fourth clock signal and output an inverted fourth clock signal as a fifth clock signal via a fourth node. The transistor string is coupled to the third node and the fourth node, and used to receive the fourth clock signal and the fifth clock signal and provide the second clock signal and the third clock signal via a fifth node and a sixth node according to the fourth clock signal and the fifth clock signal. Each of the plurality of flip-flops has a data input end and a data output end corresponding to each other, and each of the plurality of flip-flops is coupled to the fifth node and the sixth node, and used to receive the second clock signal and the third clock signal, and stores data according to the second clock signal and the third clock signal.

For a fuller understanding of the features and technical contents of the invention, please refer to the following detailed description and drawings related to the present invention. However, the description and the drawings are only intended to illustrate the invention, and not to limit the scope of the invention.

DETAILED DESCRIPTION OF PREFERRED EMBODIMENTS

Hereinafter, the present invention will be described in detail with drawings illustrating various embodiments of the present invention. However, the concept of the present invention may be embodied in many different forms and should not be construed as limitative of the exemplary embodiments set forth herein. In addition, the same reference number in the figures can be used to represent the similar elements.

Figure 1:
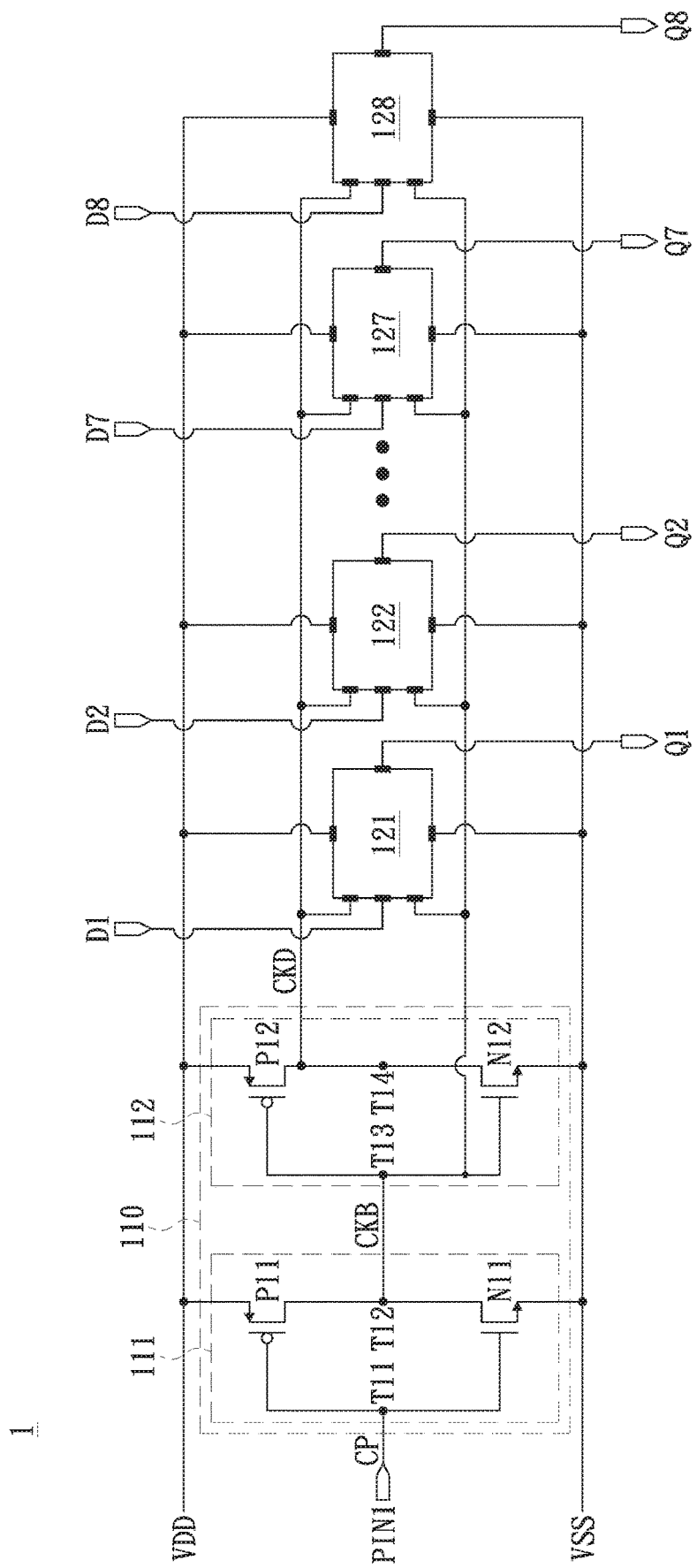
FIG. 1 is a schematic circuit diagram of a multi-bit flip-flop provided by an embodiment of the present invention.

In detail, a multi-bit flip-flop provided by an embodiment of the present invention can be applicable to any electronic device having a computing function, such as a smart phone, a game machine, a router, or a tablet, etc. In brief, the present invention does not limit the specific implementation manner of the multi-bit flip-flop of the present embodiment included in the electronic device, and those ordinarily skilled in the art should be able to make relevant designs based on actual needs or applications. Please refer to FIG. 1. FIG. 1 is a schematic circuit diagram of a multi-bit flip-flop provided by an embodiment of the present invention. A multi-bit flip-flop 1 includes a clock input pin PIN1, a clock buffer circuit 110, and a plurality of flip-flops, such as flip-flops 121 to flip-flop 128. It is worth mentioning that for a convenience of the below description, the multi-bit flip-flops in FIG. 1 are only described by using an example of eight flip-flops, but the number of the flip-flops is not intended to limit the present invention. In this embodiment, the clock input pin PIN1 is configured to receive a clock signal CP. The clock buffer circuit 110 is coupled to the clock input pin PIN1 and used to receive the clock signal CP and provide a clock signal COB and a clock signal CKD according to the clock signal CP.

As shown in FIG. 1, the clock buffer circuit 110 may include a first inverter 111 and a second inverter 112. The first inverter 111 is coupled to the clock input pin PIN1 via a node T11, and used to receive and invert the clock signal CP and output an inverted clock signal CP as the clock signal CKB via a node T12. The second inverter 112 is coupled to the node T12 via a node T13, and used to receive and invert the clock signal CKB and output an inverted clock signal CKB as the clock signal CKD via a node T14. In addition, each of the flip-flops 121-128 has a data input end and a data output end corresponding to each other. For example, the flip-flop 121 has a data input end D1 and a data output end Q1, the flip-flop 122 has a data input end D2 and a data output end Q2, and so on, the flip-flop 127 has a data input end D7 and a data output end Q7, and the flip-flop 128 has a data input end D8 and a data output end Q8. Each of the flip-flops 121-128 is coupled to the node T13 and the node T14, and used to receive the clock signal CKB and the clock signal CKD and store data according to the clock signal CKB and the clock signal CKD.

It should be understood that in this embodiment, the node T11 and the node T12 can respectively refer to an input end and an output end of the first inverter 111, and the node T13 and the node T14 can respectively refer to an input end and an output end of the second inverter 112. In addition, based on the teachings of the above, it should be understood by those having ordinary skill in the art that the multi-bit flip-flop 1 provided by this embodiment of the present invention is designed to make each of the flip-flops 121-128 couple to the node T13 and the node T14. Therefore, each of the flip-flops 121-128 is able to share the same clock signal CKB and the same clock signal CKD. It should be noted that each of the flip-flops 121-128 in this embodiment may be a static flip-flop, a dynamic flip-flop or any type of flip-flop. In brief, the present invention does not limit the specific implementation manner of the flip-flops 121-128 of the present embodiment, and those ordinarily skilled in the art should be able to make relevant designs based on actual needs or applications. However, since the operation principles of each of the flip-flops 121-128 storing data according to the clock signal CKB and the clock signal CKD are well known to those having ordinary skill in the art, the details of the above-mentioned flip-flops 121-128 will not be further described herein.

Specifically, the first inverter 111 may include a P-type metal-oxide-semiconductor field-effect transistor (PMOSFET) P11 and an N-type metal-oxide-semiconductor field-effect transistor (NMOSFET) N11 connected in series with each other, but the present invention is not limited by this connection relationship and transistor types. In this embodiment, a source of the P-type metal-oxide-semiconductor field-effect transistor P11 is coupled to a power source voltage VDD, a source of the N-type metal-oxide-semiconductor field-effect transistor N11 is coupled to a ground voltage VSS, a drain of the P-type metal-oxide-semiconductor field-effect transistor P11 and a drain of the N-type metal-oxide-semiconductor field-effect transistor N11 are commonly coupled to the node T12, and a gate of the P-type metal-oxide-semiconductor field-effect transistor P11 and a gate of the N-type metal-oxide-semiconductor field-effect transistor N11 are commonly coupled to the node T11. Similarly, the second inverter 112 may include a P-type metal-oxide-semiconductor field-effect transistor P12 and an N-type metal-oxide-semiconductor field-effect transistor N12 connected in series with each other, but the present invention is not limited by this connection relationship and transistor types. In this embodiment, a source of the P-type metal-oxide-semiconductor field-effect transistor P12 is coupled to the power source voltage VDD, a source of the N-type metal-oxide-semiconductor field-effect transistor N12 is coupled to the ground voltage VSS, a drain of the P-type metal-oxide-semiconductor field-effect transistor P12 and a drain of the N-type metal-oxide-semiconductor field-effect transistor N12 are commonly coupled to the node T14, and a gate of the P-type metal-oxide-semiconductor field-effect transistor P12 and a gate of the N-type metal-oxide-semiconductor field-effect transistor N12 are commonly coupled to the node T13.

Figure 2:
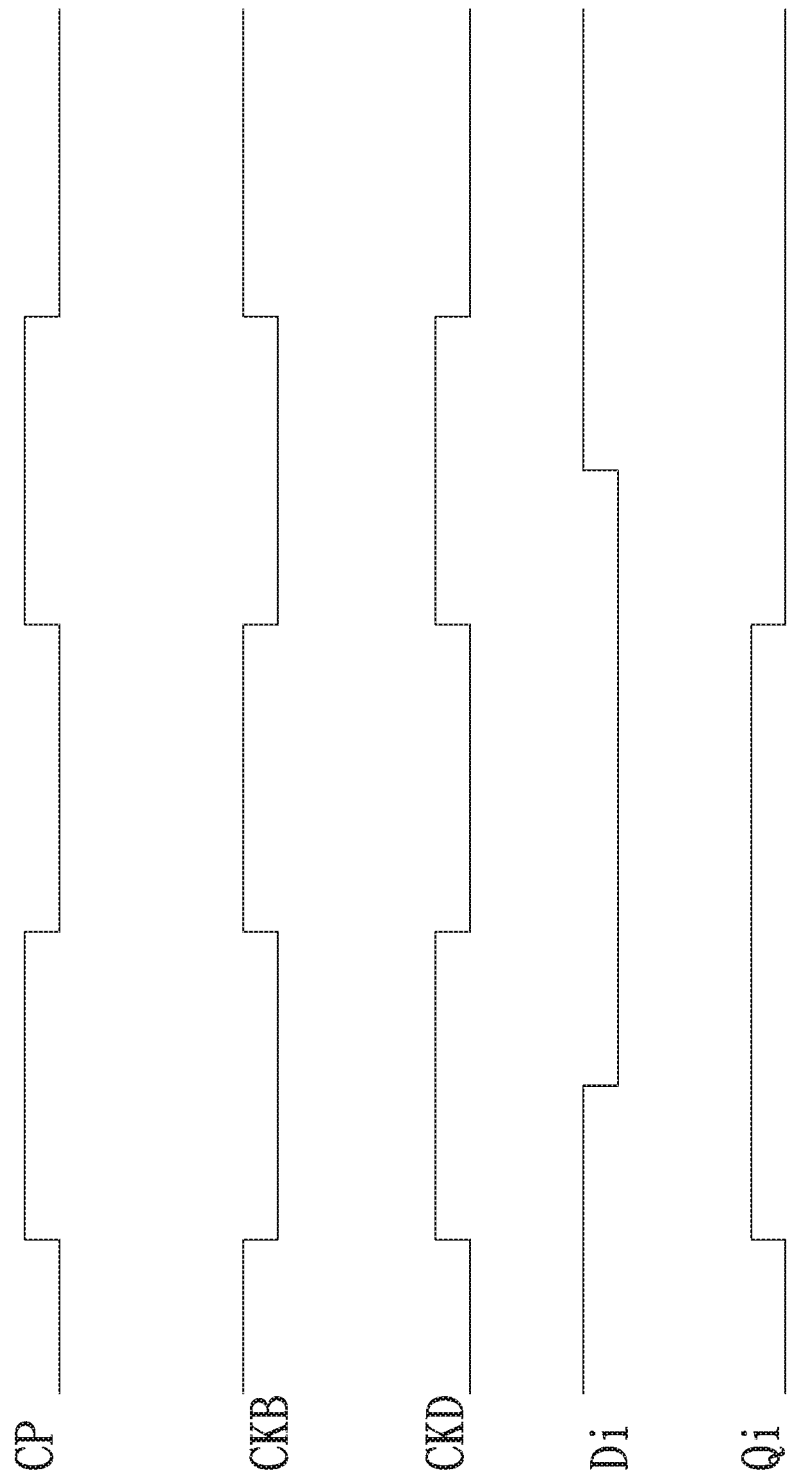
FIG. 2 is a schematic timing diagram of the multi-bit flip-flop in FIG. 1.

In details, please refer to FIG. 2 also. FIG. 2 is a schematic timing diagram of the multi-bit flip-flop in FIG. 1. As shown in FIG. 2, since a data signal input by a data input end Di of a i-th flip-flop 12$i$ (where i is any integer from 1 to 8) has a "high" logic level at a first rising edge of the clock signal CKD (i.e., at a first falling edge of the clock signal CKB), a data signal outputted by a data output end Qi of the i-th flip-flop 12$i$ can be changed from a "low" logic level to a "high" logic level. Next, since the data signal input by the data input end Di of the i-th flip-flop 12$i$ has a "low" logic level at the second rising edge of the clock signal CKD (ie, at the second falling edge of the clock signal CKB), the data signal outputted by the data output end Qi of the i-th flip-flop 12$i$ can be changed from a "high" logic level to a "low" logic level.

That is to say, in this embodiment, the i-th flip-flop 12$i$ is able to latch the data signal input by its data input end Di only at the rising edge of the clock signal CKD (or the falling edge of the clock signal CKD). Since the principles of the flip-flop 12$i$ latching data are well known to those having ordinary skill in the art, the details of the above-mentioned will not be further described herein. It should be understood that the above-mentioned P-type metal-oxide-semiconductor field-effect transistor P11, P12 and N-type metal-oxide-semiconductor field-effect transistor N11, N12 may be further implemented by an ultra low voltage trigger (uLVT) metal-oxide-semiconductor field-effect transistor, but the present invention is not limited by this type of transistor. Therefore, when the uLVT metal-oxide-semiconductor field-effect transistor is used by this embodiment, the i-th flip-flop 12$i$ only needs to perform the above-mentioned latching operation according to a relatively smaller level change on the clock signal CKB and the clock signal CKD.

Figure 3:
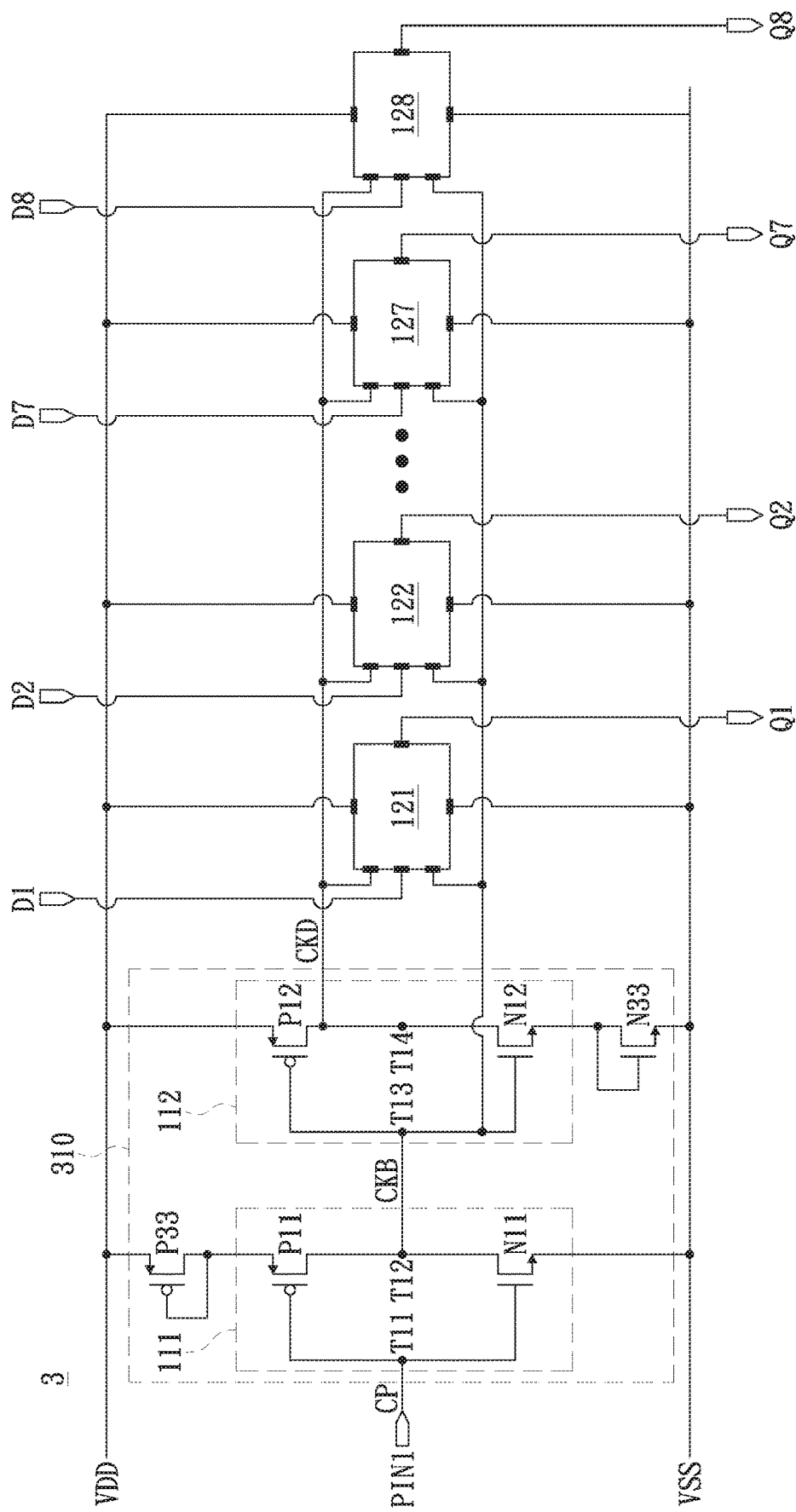
FIG. 3 is a schematic circuit diagram of a multi-bit flip-flop provided by another embodiment of the present invention.

On the other hand, if take into consideration to reduce amplitudes of the clock signal CKB and the clock signal CKD, thus, please refer to FIG. 3. FIG. 3 is a schematic circuit diagram of a multi-bit flip-flop provided by another embodiment of the present invention. Wherein, the partial components in FIG. 3 that are the same as or similar to those in FIG. 1 are denoted by the same or similar reference numerals, thus the details thereof will not be further described herein again. As shown in FIG. 3, a clock buffer circuit 310 of a multi-bit flip-flop 3 may include the first inverter 111, the second inverter 112, a P-type metal-oxide-semiconductor field-effect transistor P33, and an N-type metal-oxide-semiconductor field-effect transistor N33. In this embodiment, the P-type metal-oxide-semiconductor field-effect transistor P33 is connected in series between the P-type metal-oxide-semiconductor field-effect transistor P11 and the power source voltage VDD, wherein a source of the P-type metal-oxide-semiconductor field-effect transistor P33 is coupled to the power source voltage VDD, and a drain and a gate of the P-type metal-oxide-semiconductor field-effect transistor P33 are commonly coupled to the source of the P-type metal-oxide-semiconductor field-effect transistor P11. In addition, in this embodiment, the N-type metal-oxide-semiconductor field-effect transistor N33 is connected in series between the N-type metal-oxide-semiconductor field-effect transistor N12 and the ground voltage VSS, wherein a source of the N-type metal-oxide-semiconductor field-effect transistor N33 is coupled to the ground voltage VSS, and a drain and a gate of the N-type metal-oxide-semiconductor field-effect transistor N33 are commonly coupled to the source of the N-type metal-oxide-semiconductor field-effect transistor N12. Therefore, compared with the clock signal CKB and the clock signal CKD of FIG. 1, the clock signal CKB and the clock signal CKD of FIG. 3 both can reduce their amplitudes by 1Vt, for example, the "high" logic level of the clock signal CKB is reduced by 1Vt, and the "low" logic level of the clock signal CKD is increased by 1Vt, but the present invention does not limit the specific implementation manner of the Vt. Since the details are also the same as described in the foregoing embodiments, they will not be further described herein again.

Figure 4:
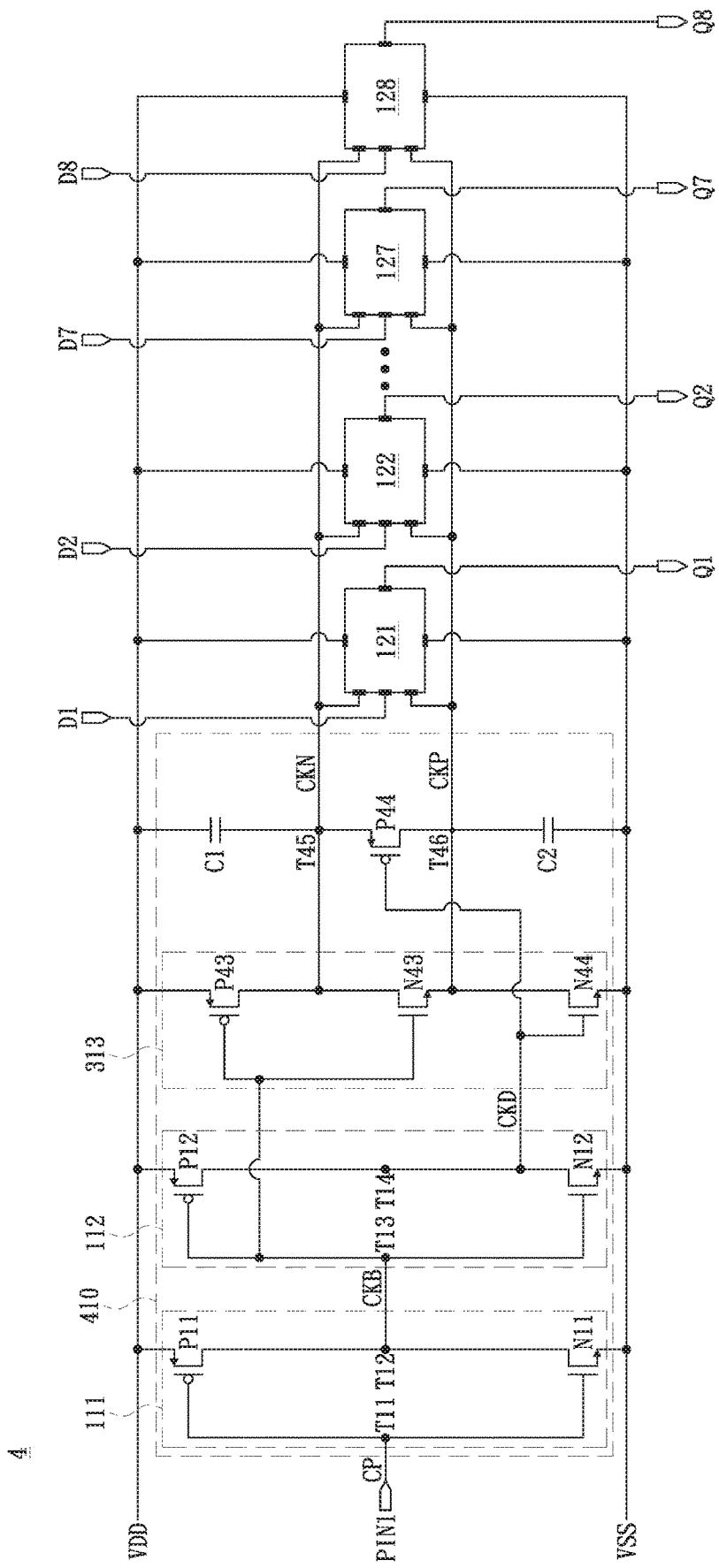
FIG. 4 is a schematic circuit diagram of a multi-bit flip-flop provided by another embodiment of the present invention.

Similarly, please refer to FIG. 4. FIG. 4 is a schematic circuit diagram of a multi-bit flip-flop provided by another embodiment of the present invention. Wherein, the partial components in FIG. 4 that are the same as or similar to those in FIG. 1 are denoted by the same or similar reference numerals, thus the details thereof will not be further described herein again. As shown in FIG. 4, compared with the clock buffer circuits 110, 310 of FIG. 1 and FIG. 3, a clock buffer circuit 410 of FIG. 4 is used to receive the clock signal CP and provide a clock signal CKN and a clock signal CKP according to the clock signal CP. In addition, each of the flip-flops 121-128 in FIG. 4 is changed to be coupled to a node T45 and a node T46, and used to receive the clock signal CKN and the clock signal CKP and store data according to the clock signal CKN and the clock signal CKP. In this embodiment, the clock buffer circuit 410 may include the first inverter 111, the second inverter 112, and a transistor string 313. The transistor string 313 is coupled to the node T13 and the node T14, and used to receive the clock signal CKB and the clock signal CKD and provide the clock signal CKN and the clock signal CKP via the node T45 and the node T46 according to the clock signal CKB and the clock signal CKD.

Specifically, the transistor string 313 may include a P-type metal-oxide-semiconductor field-effect transistor P43 and N-type metal-oxide-semiconductor field-effect transistors N43, N44 connected in series with each other. In this embodiment, a source of the P-type metal-oxide-semiconductor field-effect transistor P43 is coupled to the power source voltage VDD, a drain of the P-type metal-oxide-semiconductor field-effect transistor P43 and a drain of the N-type metal-oxide-semiconductor field-effect transistor N43 are commonly coupled to the node T45, a source of the N-type metal-oxide-semiconductor field-effect transistor N43 and a drain of the N-type metal-oxide-semiconductor field-effect transistor N44 are commonly coupled to the node T46, a source of the N-type metal-oxide-semiconductor field-effect transistor N44 is coupled to the ground voltage VSS, a gate of the P-type metal-oxide-semiconductor field-effect transistor P43 and a gate of the N-type metal-oxide-semiconductor field-effect transistor N43 are commonly coupled to the node T13, a gate of the N-type metal-oxide-semiconductor field-effect transistor N44 is coupled to the node T14. It should be understood that in this embodiment, the node T45 and the node T46 respectively refer to two output ends of the clock buffer circuit 410, the node T45 is used to provide the clock signal CKN, and the node T46 is used to provide the clock signal CKP.

Figure 5:
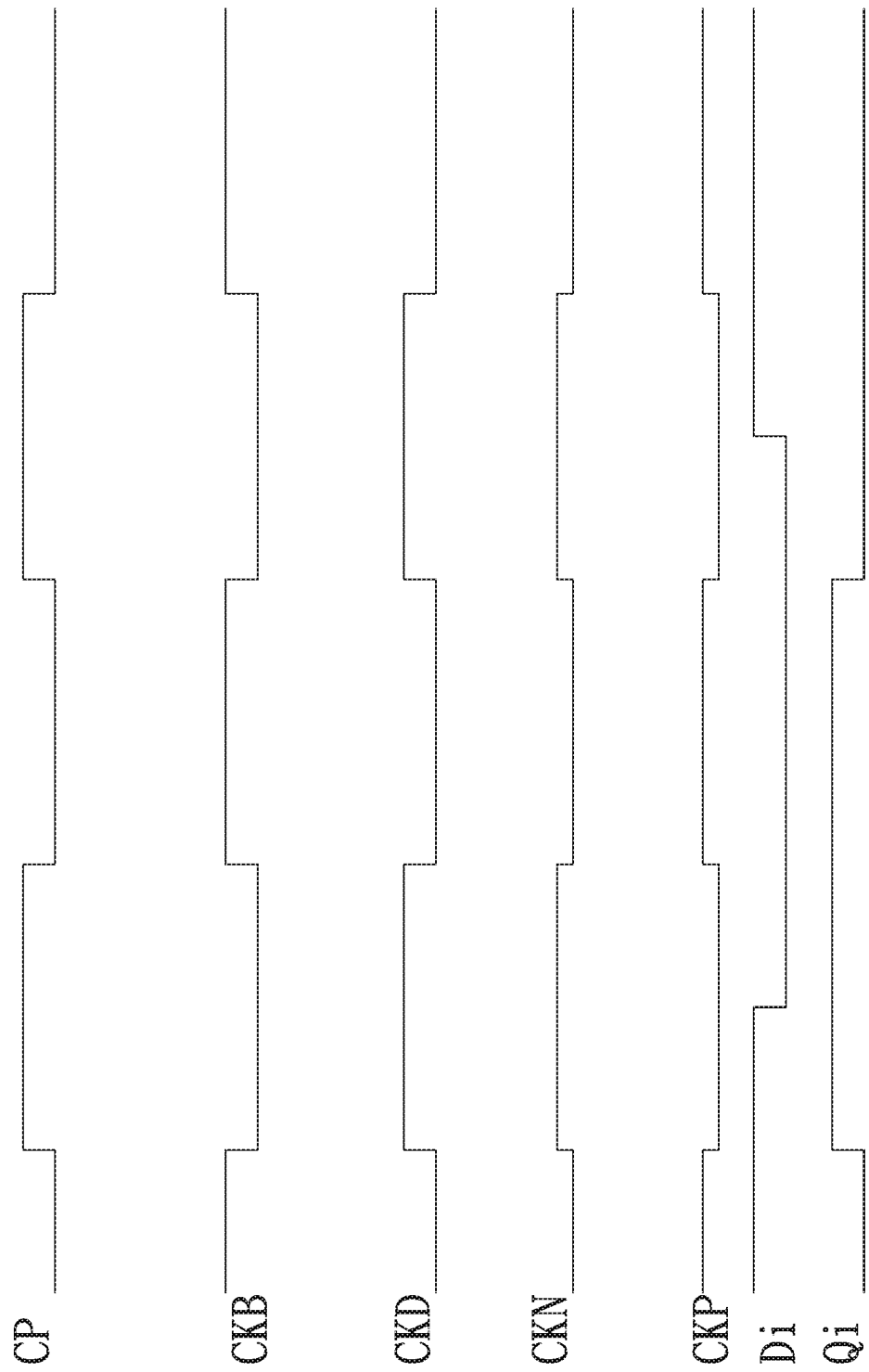
FIG. 5 is a schematic timing diagram of the multi-bit flip-flop in FIG. 4.

In addition, as shown in FIG. 4, the clock buffer circuit 410 may further include a P-type metal-oxide-semiconductor field-effect transistor P44 and capacitors C1, C2. In this embodiment, a source of the P-type metal-oxide-semiconductor field-effect transistor P44 is coupled to the node T45, a drain of the P-type metal-oxide-semiconductor field-effect transistor P44 is coupled to the node T46, a gate of the P-type metal-oxide-semiconductor field-effect transistor P44 and the gate of the N-type metal-oxide-semiconductor field-effect transistor N44 are commonly coupled to the node T14. A first end of the capacitor C1 is coupled to the power source voltage VDD, and a second end of the first capacitor C1 is coupled to the node T45. A first end of the capacitor C2 is coupled to the ground voltage VSS, and a second end of the capacitor C2 is coupled to the node T46. Next, please refer to FIG. 5 also. FIG. 5 is a schematic timing diagram of the multi-bit flip-flop in FIG. 4. Based on the teachings of the above, it should be understood by those having ordinary skill in the art that compared with the embodiments of FIG. 1 and FIG. 3, the i-th flip-flop 12*i* of FIG. 4 will be able to latch the data signal input by its data input end Di only at the rising edge of the clock signal CKN (or the falling edge of the clock signal CKP). It should be understood that since the P-type metal-oxide-semiconductor field-effect transistors P34, P44 and the N-type metal-oxide-semiconductor field-effect transistors N43, N44 are used in this embodiment, the clock signal CKN and the clock signal CKP of FIG. 4 both can reduce their amplitudes to half of the high level, compared with the clock signal CKB and the clock signal CKD of FIG. 1, as shown in FIG. 5. Since the details are also the same as described in the foregoing embodiments, they will not be further described herein again.

Figure 6:
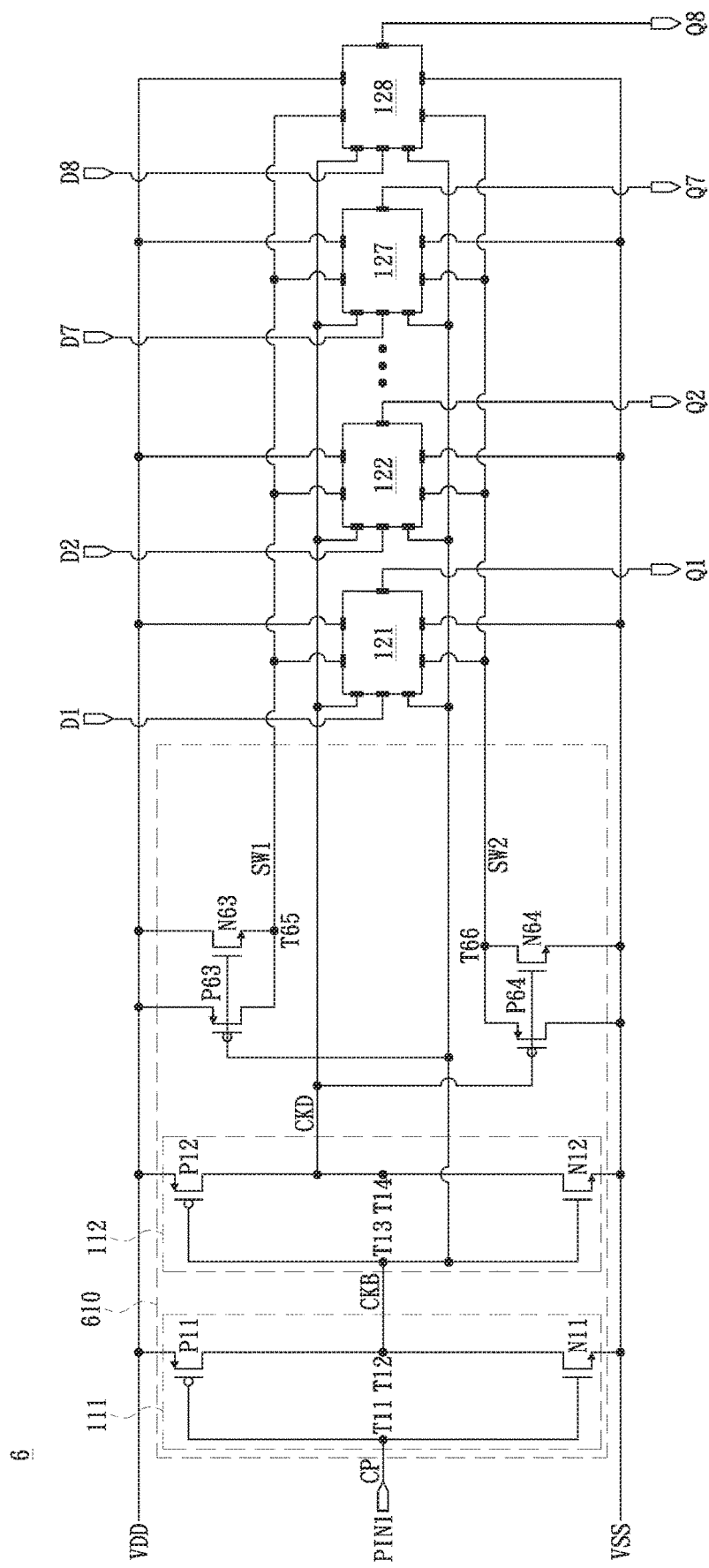
FIG. 6 is a schematic circuit diagram of a multi-bit flip-flop provided by another embodiment of the present invention.

On the other hand, if take into consideration to make the multi-bit flip-flop 1 of FIG. 1 more capable of having a clock-controlled power switch function, thus please refer to FIG. 6 also. FIG. 6 is a schematic circuit diagram of a multi-bit flip-flop provided by another embodiment of the present invention. Wherein, the partial components in FIG. 6 that are the same as or similar to those in FIG. 1 are denoted by the same or similar reference numerals, thus the details thereof will not be further described herein again. As shown in FIG. 6, a clock buffer circuit 610 is further used to provide a power switch signal SW1 and a power switch signal SW2 via a node T65 and a node T66 according to the clock signal CKB and the clock signal CKD, and each of the flip-flops 121-128 is further coupled to the node T65 and the node T66 and used to receive the power switch signal SW1 and the power switch signal SW2. It should be understood that in the embodiment, the node T65 is used to provide the power switch signal SW1, and the node T66 is used to provide the power switch signal SW2.

Specifically, the clock buffer circuit 610 of FIG. 6 may include the first inverter 111, the second inverter 112, P-type metal-oxide-semiconductor field-effect transistors P63, P64, and N-type metal-oxide-semiconductor field-effect transistors N63, N64. In this embodiment, a source of the P-type metal-oxide-semiconductor field-effect transistor P63 is coupled to the power source voltage VDD, a drain of the P-type metal-oxide-semiconductor field-effect transistor P63 is coupled to the node T65, a gate of the P-type metal-oxide-semiconductor field-effect transistor P63 and the flip-flops 121-128 are commonly coupled to the node T13. In addition, a source of the N-type metal-oxide-semiconductor field-effect transistor N63 is coupled to the node T65, a drain of the N-type metal-oxide-semiconductor field-effect transistor N63 is coupled to the power source voltage VDD, a gate of the N-type metal-oxide-semiconductor field-effect transistor N63 and the gate of the P-type metal-oxide-semiconductor field-effect transistor P63 are commonly coupled to the node T13. Similarly, a source of the P-type metal-oxide-semiconductor field-effect transistor P64 is coupled to the node T66, a drain of the P-type metal-oxide-semiconductor field-effect transistor P64 is coupled to the ground voltage VSS, a gate of the P-type metal-oxide-semiconductor field-effect transistor P64 and the flip-flops 121-128 are commonly coupled to the node T14. In addition, a source of the N-type metal-oxide-semiconductor field-effect transistor N64 is coupled to the ground voltage VSS, a drain of the N-type metal-oxide-semiconductor field-effect transistor N64 is coupled to the node T66, a gate of the N-type metal-oxide-semiconductor field-effect transistor N64 and the gate of the P-type metal-oxide-semiconductor field-effect transistor P64 are commonly coupled to the node T14.

Figure 7:
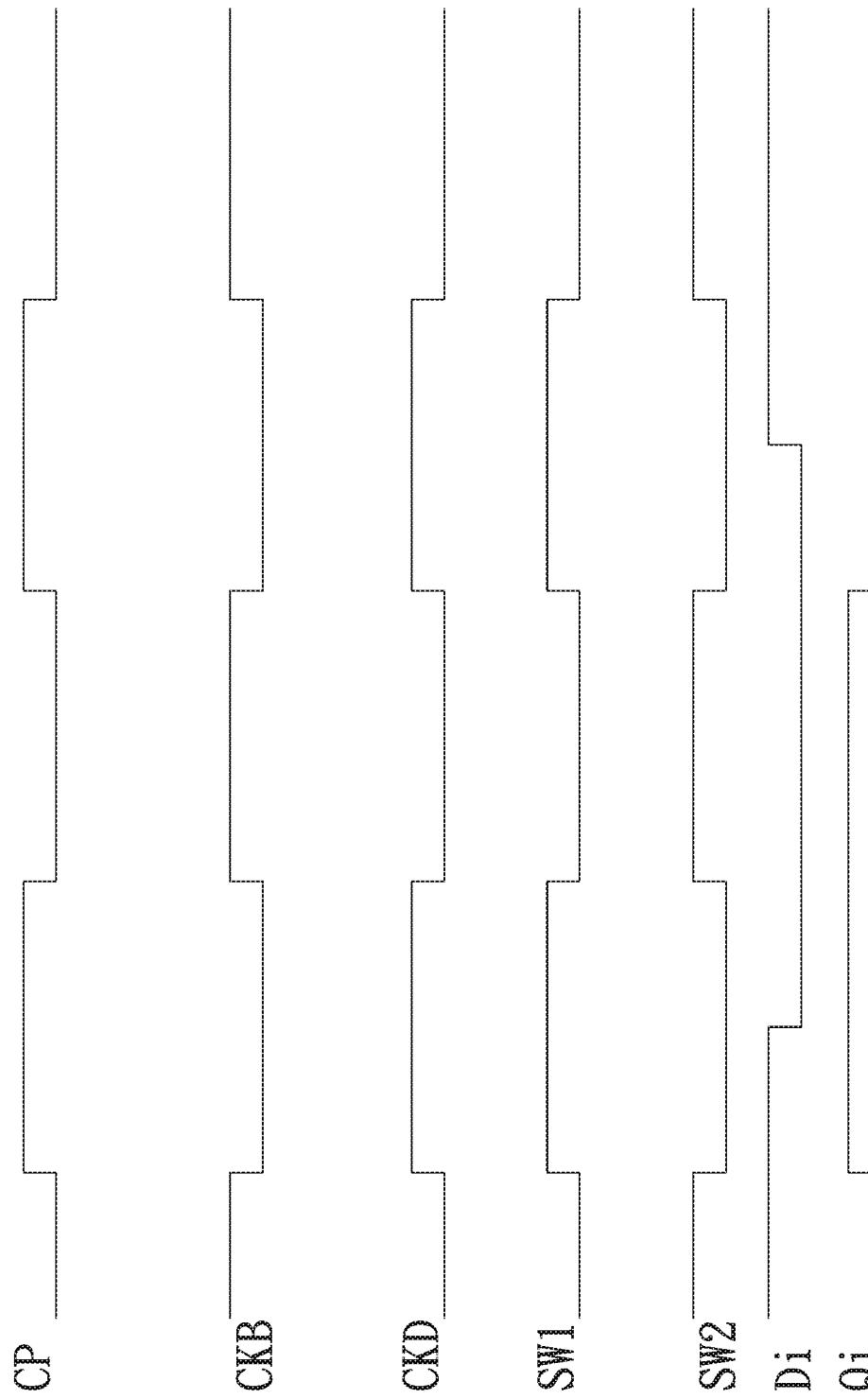
FIG. 7 is a schematic timing diagram of the multi-bit flip-flop in FIG. 6.

Next, please refer to FIG. 7 also. FIG. 7 is a schematic timing diagram of the multi-bit flip-flop in FIG. 6. Based on the teachings of the above, it should be understood by those having ordinary skill in the art that the above-mentioned P-type metal-oxide-semiconductor field-effect transistors P63, P64 and N-type metal-oxide-semiconductor field-effect transistors N63, N64 can be viewed as a weak keeper circuit as a whole. That is to say, the multi-bit flip-flop 6 provided by this embodiment is designed to use the weak keeper circuit as a power switch when the clock signal CP is at a low logic level. In general, a strong keeper circuit and a weak keeper circuit are usually distinguished by designing different threshold voltages or channel lengths. In brief, the present invention does not limit the specific implementation manner of the weak keeper circuit, and those ordinarily skilled in the art should be able to make related designs according to actual needs or applications. It should be noted that since the operational principles of the flip-flop having the power switch function are also well known to those of ordinary skill in the art, the details of the above-mentioned content will not be further described herein.

Figure 8:
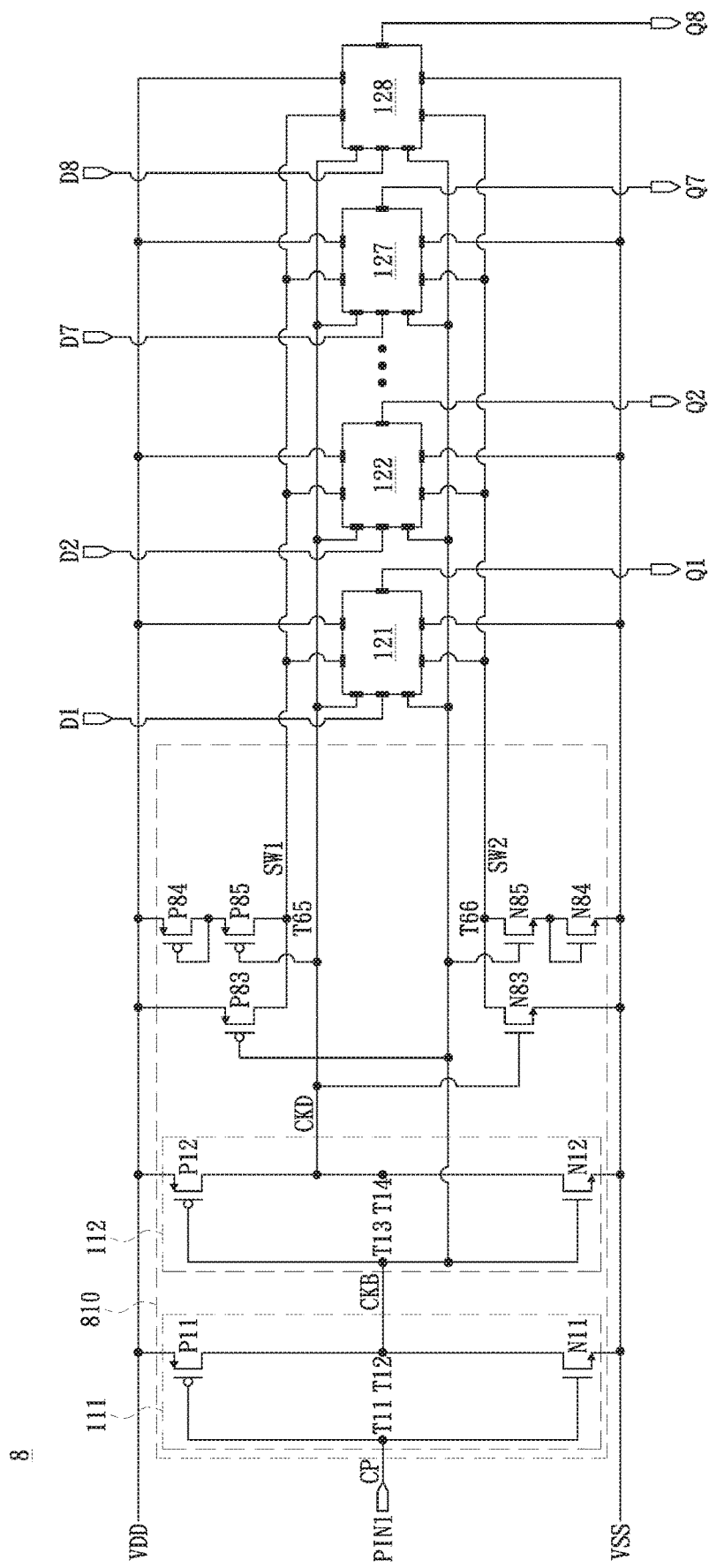
FIG. 8 is a schematic circuit diagram of a multi-bit flip-flop provided by another embodiment of the present invention.

On the other hand, if take into consideration the multi-bit flip-flop 1 of FIG. 1 can also have a clock-controlled power switch function and also take into consideration to reduce the amplitude of the power switch signal SW1 and the power switch signal SW2 as shown in FIG. 6 at the same time, thus please refer to FIG. 8 also. FIG. 8 is a schematic circuit diagram of a multi-bit flip-flop provided by another embodiment of the present invention. Wherein, the partial components in FIG. 8 that are the same as or similar to those in FIG. 6 are denoted by the same or similar reference numerals, thus the details thereof will not be further described herein again. As shown in FIG. 8, compared with the clock buffer circuit 610 of FIG. 6, a clock buffer circuit 810 of FIG. 8 may include the first inverter 111, the second inverter 112, P-type metal-oxide-semiconductor field-effect transistors P83, P84, P85, and N-type metal-oxide-semiconductor field-effect transistors N83, N84, N85. In this embodiment, a source of the P-type metal-oxide-semiconductor field-effect transistor P83 is coupled to the power source voltage VDD, a drain of the P-type metal-oxide-semiconductor field-effect transistor P83 is coupled to the node T65, a gate of the P-type metal-oxide-semiconductor field-effect transistor P83 and the flip-flops 121-128 are commonly coupled to the node T13. In addition, a source of the P-type metal-oxide-semiconductor field-effect transistor P84 is coupled to the power source voltage VDD, a drain and a gate of the P-type metal-oxide-semiconductor field-effect transistor P84 are commonly coupled to a source of the P-type metal-oxide-semiconductor field-effect transistor P85, a drain of the P-type metal-oxide-semiconductor field-effect transistor P85 is coupled to the node T65, a gate of the P-type metal-oxide-semiconductor field-effect transistor P85 and the flip-flops 121-128 are commonly coupled to the node T14.

Similarly, a source of the N-type metal-oxide-semiconductor field-effect transistor N83 is coupled to the ground voltage VSS, a drain of the N-type metal-oxide-semiconductor field-effect transistor N83 is coupled to the node T66, a gate of the N-type metal-oxide-semiconductor field-effect transistor N83 and the flip-flops 121-128 are commonly coupled to the node T14. A source of the N-type metal-oxide-semiconductor field-effect transistor N84 is coupled to the ground voltage VSS, a drain and a gate of the N-type metal-oxide-semiconductor field-effect transistor N84 are commonly coupled to a source of the N-type metal-oxide-semiconductor field-effect transistor N85, a drain of the N-type metal-oxide-semiconductor field-effect transistor N85 is coupled to the node T66, a gate of the N-type metal-oxide-semiconductor field-effect transistor N85 and the flip-flops 121-128 are commonly coupled to the node T13. Therefore, compared with the power switch signal SW1 and the power switch signal SW2 of FIG. 6, the power switch signal SW1 and the power switch signal SW2 of FIG. 8 both can reduce their amplitudes by 1Vt, for example, the "high" logic level of the power switch signal SW1 is reduced by 1Vt, and the "low" logic level of the power switch signal SW2 is increased by 1Vt, but the present invention does not limit the specific implementation manner of the Vt. Since the details are also the same as described in the foregoing embodiments, they will not be further described herein again.

Figure 9:
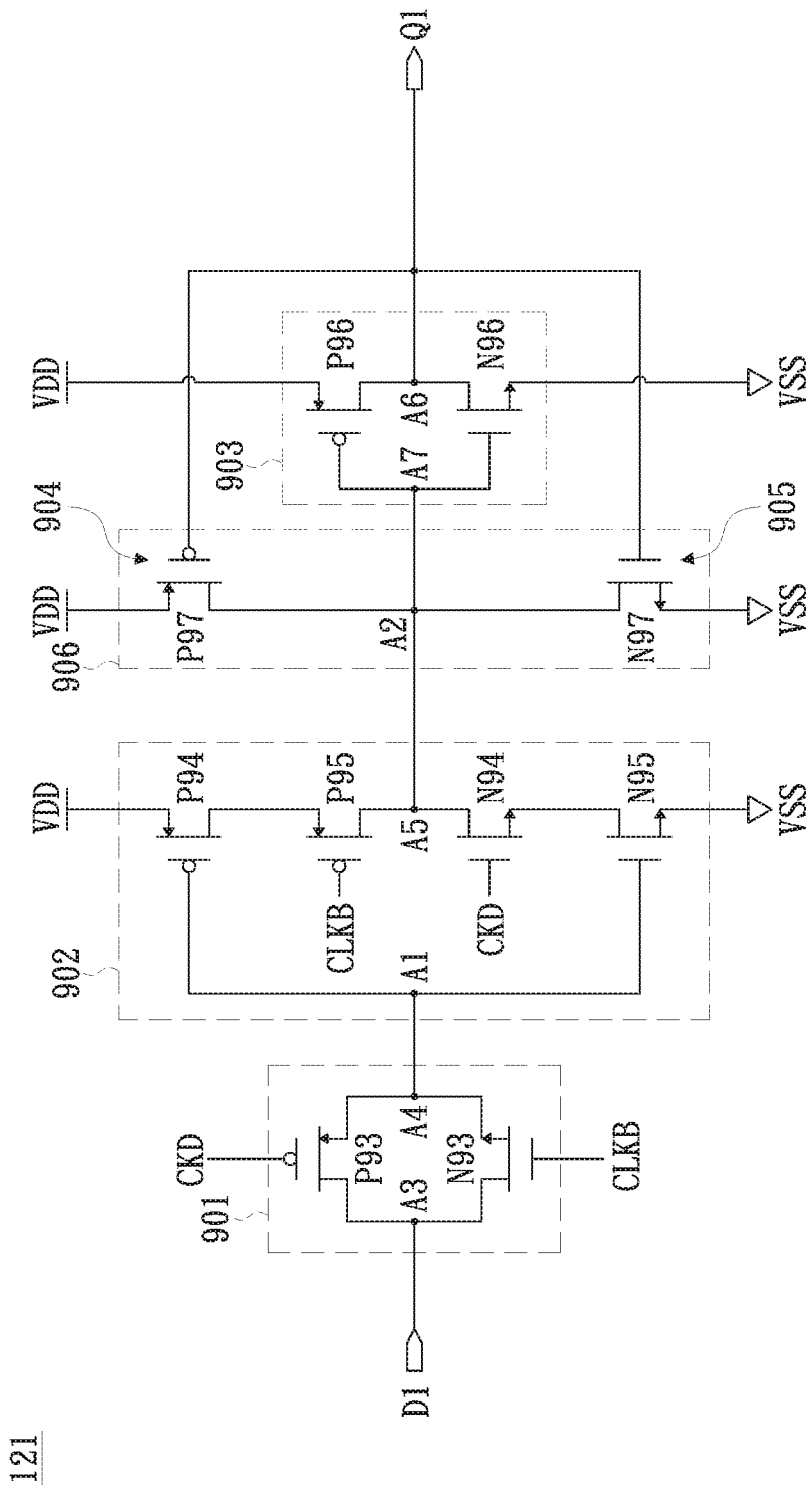
FIG. 9 is a schematic circuit diagram of a flip-flop in the multi-bit flip-flop of FIG. 1.

Finally, as described in the foregoing content, each of the plurality of flip-flops 121-128 may be a dynamic flip-flop, thus please refer to FIG. 9. FIG. 9 is a schematic circuit diagram of a flip-flop in the multi-bit flip-flop of FIG. 1. Wherein, the partial components in FIG. 9 that are the same as or similar to those in FIG. 1 are denoted by the same or similar reference numerals, and thus the details thereof will not be further described herein again. It is worth mentioning that for a convenience of the below description, this embodiment is only described by using an example of the flip-flop 121. As shown in FIG. 9, the flip-flop 121 includes a transmission gate 901, a third inverter 902, a fourth inverter 903, a pull-up transistor 904, and a pull-down transistor 905. The transmission gate 901 is coupled to the data input end D1 of the flip-flop 121, and used to receive a first data signal (not drawn) and output the first data signal to a sub-node A1 according to the clock signal CKB and the clock signal CKD. The third inverter 902 is coupled to the transmission gate 901 via the sub-node A1, and used to invert the first data signal and output the inverted first data signal to a sub-node A2. The fourth inverter 903 is coupled between the sub-node A2 and the data output end Q1 of the flip-flop 121, and used to invert the inverted first data signal in order to generate a second data signal (not drawn) and output the second data signal to the output end Q1 of the flip-flop 121. The pull-up transistor 904 is coupled between the sub-node A2 and the power source voltage VDD, and used to pull up a voltage of the sub-node A2 to the power source voltage VDD. The pull-down transistor 905 is coupled between the sub-node A2 and the ground voltage VSS, and used to pull down the voltage of the sub-node A2 to the ground voltage VSS. It should be understood that the "sub-node A1" of the embodiment refers to a node where the transmission gate 901 is connected to the third inverter 902, and the "sub-node A2" refers to a node where the third inverter 902 is connected to the third inverter 903.

In this embodiment, the transmission gate 901 includes a N-type metal-oxide-semiconductor field-effect transistor N93 and a P-type metal-oxide-semiconductor field-effect transistor P93 connected in parallel with each other, a drain of the N-type metal-oxide-semiconductor field-effect transistor N93 and a drain of the P-type metal-oxide-semiconductor field-effect transistor P93 are commonly coupled to the data input end D1 of the flip-flop 121 via a sub-node A3, a source of the N-type metal-oxide-semiconductor field-effect transistor N93 and a source of the P-type metal-oxide-semiconductor field-effect transistor P93 are commonly coupled to the sub-node A1 via a sub-node A4, a gate of the N-type metal-oxide-semiconductor field-effect transistor N93 is used to receive the clock signal CKB, and a gate of the P-type metal-oxide-semiconductor field-effect transistor P93 is used to receive the clock signal CKD. It should be understood that the "sub-node A3" of this embodiment refers to a node where the drain of the N-type metal-oxide-semiconductor field-effect transistor N93 is connected to the drain of the P-type metal-oxide-semiconductor field-effect transistor P93, and the "sub-node A4" refers to a node where the source of the N-type metal-oxide-semiconductor field-effect transistor N93 is connected to the source of the P-type metal-oxide-semiconductor field-effect transistor P93.

In addition, the third inverter 902 is a tri-state inverter, and includes P-type metal-oxide-semiconductor field-effect transistors P94, P95, and N-type metal-oxide-semiconductor field-effect transistors N94, N95 connected in series with each other, a source of the P-type metal-oxide-semiconductor field-effect transistor P94 is coupled to the power source voltage VDD, a source of the N-type metal-oxide-semiconductor field-effect transistor N95 is coupled to the ground voltage VSS, a gate of the P-type metal-oxide-semiconductor field-effect transistor P94 and a gate of the N-type metal-oxide-semiconductor field-effect transistor N95 are respectively coupled to the sub-node A1 for receiving the first data signal, a source of the P-type metal-oxide-semiconductor field-effect transistor P95 is coupled to a drain of the P-type metal-oxide-semiconductor field-effect transistor P94, a source of the N-type metal-oxide-semiconductor field-effect transistor N94 is coupled to a drain of the N-type metal-oxide-semiconductor field-effect transistor N95, a drain of the P-type MOS field-effect transistor P95 and a drain of the N-type metal-oxide-semiconductor field-effect transistor N94 are commonly coupled to the sub-node A2 via a sub-node A5, a gate of the P-type metal-oxide-semiconductor field-effect transistor P95 is used to receive the clock signal CKB, and a gate of the N-type metal-oxide-semiconductor field-effect transistor N94 is used to receive the clock signal CKD.

The fourth inverter 903 includes a P-type metal-oxide-semiconductor field-effect transistor P96 and a N-type metal-oxide-semiconductor field-effect transistor N96 connected in series with each other, a source of the P-type metal-oxide-semiconductor field-effect transistor P96 is coupled to the power source voltage VDD, a source of the N-type metal-oxide-semiconductor field-effect transistor N96 is coupled to the ground voltage VSS, a drain of the P-type metal-oxide-semiconductor field-effect transistor P96 and a drain of the N-type metal-oxide-semiconductor field-effect transistor N96 are commonly coupled to the data output end Q1 of the flip-flop 121 via a sub-node A6, and a gate of the P-type metal-oxide-semiconductor field-effect transistor P96 and a gate of the N-type metal-oxide-semi-conductor field-effect transistor N96 are commonly coupled to the sub-node A2 via a sub-node A7 for receiving the inverted first data signal. Moreover, the pull-up transistor 904 is a P-type metal-oxide-semiconductor field-effect transistor P97, the pull-down transistor 905 is a N-type metal-oxide-semiconductor field-effect transistor N97, a source of the P-type metal-oxide-semiconductor field-effect transistor P97 is coupled to the power source voltage VDD, a source of the N-type metal-oxide-semiconductor field-effect transistor N97 is coupled to the ground voltage VSS, a drain of the P-type metal-oxide-semiconductor field-effect transistor P97 and a drain of the N-type metal-oxide-semiconductor field-effect transistor N97 are respectively coupled to the sub-node A2, and a gate of the P-type metal-oxide-semiconductor field-effect transistor P97 and a gate of the N-type metal-oxide-semiconductor field-effect transistor N97 are respectively coupled to the data output end Q1 of the flip-flop 121 for receiving the second data signal.

It should be noted that in this embodiment, the pull-up transistor 904 and the pull-down transistor 905 constitute a feedback inverter 906, and the feedback inverter is configured as a weak keeper circuit compared to the third inverter 902. That is to say, when the next new batch of data is to be written, the third inverter 902 and the feedback inverter 906 may easily cause data collision on the sub-node A2, thus the signal output capability of the third inverter 902 must be greater than the signal output capability of the feedback inverter 906, so that the data on the sub-node A2 can be forced to be updated. Therefore, the feedback inverter 906 must be configured as a weak keeper circuit as compared to the third inverter 902. Since the operational principles of the P-type metal-oxide-semiconductor field-effect transistors P93, P94, P95, P96, P97 and the N-type metal-oxide-semiconductor field-effect transistors N93, N94, N95, N96, N97 are well known to those of ordinarily skilled in the art, the details of the above-described flip-flop 121 will not be further described herein.

In summary, the multi-bit flip-flop provided by the embodiments of the present invention is designed such that each flip-flop can share the same clock, thereby improving the clock path of the multi-bit flip-flop. In addition, the multi-bit flip-flop provided by the embodiments of the present invention is also designed to reduce the clock amplitude and have the advantage of the clock-controlled power switch function.

The above description is only embodiments of the present invention, and is not intended to limit the scope of the patent of the present invention.

What is claimed is:

1. A multi-bit flip-flop, comprising:
   a clock input pin, configured to receive a first clock signal;
   a clock buffer circuit, coupled to the clock input pin, and used to receive the first clock signal and provide a second clock signal and a third clock signal according to the first clock signal, wherein the clock buffer circuit comprises:
      a first inverter, coupled to the clock input pin via a first node, and used to receive and invert the first clock signal and output the inverted first clock signal as the second clock signal via a second node; and
      a second inverter, coupled to the second node via a third node, and used to receive and invert the second clock signal and output the inverted second clock signal as the third clock signal via a fourth node; and
   a plurality of flip-flops, wherein each of the plurality of flip-flops has a data input end and a data output end corresponding to each other, and each of the plurality of flip-flops is coupled to the third node and the fourth node, and used to receive the second clock signal and the third clock signal and store data according to the second clock signal and the third clock signal;

wherein the clock buffer circuit is further used to provide a first power switch signal and a second power switch signal via a fifth node and a sixth node according to the second clock signal and the third clock signal, and each of the plurality of flip-flops is further coupled to the fifth node and the sixth node and used to receive the first power switch signal and the second power switch signal.

2. The multi-bit flip-flop as claimed in claim 1, wherein the first inverter comprises a first P-type metal-oxide-semiconductor field-effect transistor (PMOSFET) and a first N-type metal-oxide-semiconductor field-effect transistor (NMOSFET) connected in series with each other, wherein a source of the first P-type metal-oxide-semiconductor field-effect transistor is coupled to a power source voltage, a source of the first N-type metal-oxide-semiconductor field-effect transistor is coupled to a ground voltage, a drain of the first P-type metal-oxide-semiconductor field-effect transistor and a drain of the first N-type metal-oxide-semiconductor field-effect transistor are commonly coupled to the second node, and a gate of the first P-type metal-oxide-semiconductor field-effect transistor and a gate of the first N-type metal-oxide-semiconductor field-effect transistor are commonly coupled to the first node.

3. The multi-bit flip-flop as claimed in claim 2, wherein the second inverter comprises a second P-type metal-oxide-semiconductor field-effect transistor and a second N-type metal-oxide-semiconductor field-effect transistor connected in series with each other, wherein a source of the second P-type metal-oxide-semiconductor field-effect transistor is coupled to the power source voltage, a source of the second N-type metal-oxide-semiconductor field-effect transistor is coupled to the ground voltage, a drain of the second P-type metal-oxide-semiconductor field-effect transistor and a drain of the second N-type metal-oxide-semiconductor field-effect transistor are commonly coupled to the fourth node, and a gate of the second P-type metal-oxide-semiconductor field-effect transistor and a gate of the second N-type metal-oxide-semiconductor field-effect transistor are commonly coupled to the third node.

4. The multi-bit flip-flop as claimed in claim 3, wherein the clock buffer circuit further comprises:
 a third P-type metal-oxide-semiconductor field-effect transistor, connected in series between the first P-type metal-oxide-semiconductor field-effect transistor and the power source voltage, wherein a source of the third P-type metal-oxide-semiconductor field-effect transistor is coupled to the power source voltage, and a drain and a gate of the third P-type metal-oxide-semiconductor field-effect transistor are commonly coupled to the source of the first P-type metal-oxide-semiconductor field-effect transistor; and
 a third N-type metal-oxide-semiconductor field-effect transistor, connected in series between the second N-type metal-oxide-semiconductor field-effect transistor and the ground voltage, wherein a source of the third N-type metal-oxide-semiconductor field-effect transistor is coupled to the ground voltage, and a drain and a gate of the third N-type metal-oxide-semiconductor field-effect transistor are commonly coupled to the source of the second N-type metal-oxide-semiconductor field-effect transistor.

5. The multi-bit flip-flop as claimed in claim 3, wherein the clock buffer circuit further comprises:
 a third P-type metal-oxide-semiconductor field-effect transistor, wherein a source of the third P-type metal-oxide-semiconductor field-effect transistor is coupled to the power source voltage, a drain of the third P-type metal-oxide-semiconductor field-effect transistor is coupled to the fifth node, and a gate of the third P-type metal-oxide-semiconductor field-effect transistor and the plurality of flip-flops are commonly coupled to the third node;
 a third N-type metal-oxide-semiconductor field-effect transistor, wherein a source of the third N-type metal-oxide-semiconductor field-effect transistor is coupled to the fifth node, a drain of the third N-type metal-oxide-semiconductor field-effect transistor is coupled to the power source voltage, and a gate of the third N-type metal-oxide-semiconductor field-effect transistor and the gate of the third P-type metal-oxide-semiconductor field-effect transistor are commonly coupled to the third node;
 a fourth P-type metal-oxide-semiconductor field-effect transistor, wherein a source of the fourth P-type metal-oxide-semiconductor field-effect transistor is coupled to the sixth node, a drain of the fourth P-type metal-oxide-semiconductor field-effect transistor is coupled to the ground voltage, and a gate of the fourth P-type metal-oxide-semiconductor field-effect transistor and the plurality of flip-flops are commonly coupled to the fourth node; and
 a fourth N-type metal-oxide-semiconductor field-effect transistor, wherein a source of the fourth N-type metal-oxide-semiconductor field-effect transistor is coupled to the ground voltage, a drain of the fourth N-type metal-oxide-semiconductor field-effect transistor being coupled to the sixth node, and a gate of the fourth N-type metal-oxide-semiconductor field-effect transistor and the gate of the fourth P-type metal-oxide-semiconductor field-effect transistor being commonly coupled to the fourth node.

6. The multi-bit flip-flop as claimed in claim 5, wherein the clock buffer circuit further comprises:
 a third P-type metal-oxide-semiconductor field-effect transistor, wherein a source of the third P-type metal-oxide-semiconductor field-effect transistor is coupled to the power source voltage, a drain of the third P-type metal-oxide-semiconductor field-effect transistor is coupled to the fifth node, and a gate of the third P-type metal-oxide-semiconductor field-effect transistor and the plurality of flip-flops are commonly coupled to the third node;
 a fourth and a fifth P-type metal-oxide-semiconductor field-effect transistors, wherein a source of the fourth P-type metal-oxide-semiconductor field-effect transistor is coupled to the power source voltage, a drain and a gate of the fourth P-type metal-oxide-semiconductor field-effect transistor are commonly coupled to a source of the fifth P-type metal-oxide-semiconductor field-effect transistor, a drain of the fifth P-type metal-oxide-semiconductor field-effect transistor is coupled to the fifth node, and a gate of the fifth P-type metal-oxide-semiconductor field-effect transistor and the plurality of flip-flops are commonly coupled to the fourth node;
 a third N-type metal-oxide-semiconductor field-effect transistor, wherein a source of the third N-type metal-oxide-semiconductor field-effect transistor is coupled to the ground voltage, a drain of the third N-type metal-oxide-semiconductor field-effect transistor is coupled to the sixth node, and a gate of the third N-type metal-oxide-semiconductor field-effect transistor and the plurality of flip-flops are commonly coupled to the fourth node; and a fourth and a fifth N-type metal-oxide-semiconductor field-effect transistors, wherein a source of the fourth N-type metal-oxide-semiconductor field-effect transistor is coupled to the ground voltage, a drain and a gate of the fourth N-type metal-oxide-semiconductor field-effect transistor are commonly coupled to a source of the fifth N-type metal-oxide-semiconductor field-effect transistor, a drain of the fifth N-type metal-oxide-semiconductor field-effect transistor is coupled to the sixth node, and a gate of the fifth N-type metal-oxide-semiconductor field-effect transistor and the plurality of flip-flops are commonly coupled to the third node.

7. The multi-bit flip-flop as claimed in claim 3, wherein each of the plurality of flip-flops is a dynamic flip-flop and comprises:

a transmission gate, coupled to the data input end of the flip-flop, and used to receive a first data signal and output the first data signal to a first sub-node according to the second clock signal and the third clock signal;

a third inverter, coupled to the transmission gate via the first sub-node, and used to invert the first data signal and output the inverted first data signal to a second sub-node;

a fourth inverter, coupled between the second sub-node and the data output end of the flip-flop, and used to invert the inverted first data signal to generate a second data signal and output the second data signal to the output end of the flip-flop;

a pull-up transistor, coupled between the second sub-node and the power source voltage, and used to pull up a voltage of the second sub-node to the power source voltage; and a pull-down transistor, coupled between the second sub-node and the ground voltage, and used to pull down the voltage of the second sub-node to the ground voltage.

8. The multi-bit flip-flop as claimed in claim 7, wherein the transmission gate comprises a third N-type metal-oxide-semiconductor field-effect transistor and a third P-type metal-oxide-semiconductor field-effect transistor connected in parallel with each other, a drain of the third N-type metal-oxide-semiconductor field-effect transistor and a drain of the third P-type metal-oxide-semiconductor field-effect transistor are commonly coupled to the data input end of the flip-flop via a third sub-node, a source of the third N-type metal-oxide-semiconductor field-effect transistor and a source of the third P-type metal-oxide-semiconductor field-effect transistor are commonly coupled to the first sub-node via a fourth sub-node, a gate of the third N-type metal-oxide-semiconductor field-effect transistor is used to receive the second clock signal, and a gate of the third P-type metal-oxide-semiconductor field-effect transistor is used to receive the third clock signal.

9. The multi-bit flip-flop as claimed in claim 8, wherein the third inverter is a tri-state inverter and comprises a fourth P-type metal-oxide-semiconductor field-effect transistor, a fifth P-type metal-oxide-semiconductor field-effect transistor, a fourth N-type metal-oxide-semiconductor field-effect transistor and a fifth N-type metal-oxide-semiconductor field-effect transistor connected in series with each other, a source of the fourth P-type metal-oxide-semiconductor field-effect transistor is coupled to the power source voltage, a source of the fifth N-type metal-oxide-semiconductor field-effect transistor is coupled to the ground voltage, a gate of the fourth P-type metal-oxide-semiconductor field-effect transistor and a gate of the fifth N-type metal-oxide-semiconductor field-effect transistor are respectively coupled to the first sub-node for receiving the first data signal, a source of the fifth P-type metal-oxide-semiconductor field-effect transistor is coupled to a drain of the fourth P-type metal-oxide-semiconductor field-effect transistor, a source of the fourth N-type metal-oxide-semiconductor field-effect transistor is coupled to a drain of the fifth N-type metal-oxide-semiconductor field-effect transistor, a drain of the fifth P-type metal-oxide-semiconductor field-effect transistor and a drain of the fourth N-type metal-oxide-semiconductor field-effect transistor are commonly coupled to the second sub-node via a fifth sub-node, a gate of the fifth P-type metal-oxide-semiconductor field-effect transistor is used to receive the second clock signal, and a gate of the fourth N-type metal-oxide-semiconductor field-effect transistor is used to receive the third clock signal.

10. The multi-bit flip-flop as claimed in claim 9, wherein the fourth inverter comprises a sixth P-type metal-oxide-semiconductor field-effect transistor and a sixth N-type metal-oxide-semiconductor field-effect transistor connected in series with each other, a source of the sixth P-type metal-oxide-semiconductor field-effect transistor is coupled to the power source voltage, a source of the sixth N-type metal-oxide-semiconductor field-effect transistor is coupled to the ground voltage, a drain of the sixth P-type metal-oxide-semiconductor field-effect transistor and a drain of the sixth N-type metal-oxide-semiconductor field-effect transistor are commonly coupled to the data output end of the flip-flop via a sixth sub-node, and a gate of the sixth P-type metal-oxide-semiconductor field-effect transistor and a gate of the sixth N-type metal-oxide-semiconductor field-effect transistor are commonly coupled to the second sub-node via a seventh sub-node for receiving the inverted first data signal.

11. The multi-bit flip-flop as claimed in claim 10, wherein the pull-up transistor is a seventh P-type metal-oxide-semiconductor field-effect transistor, the pull-down transistor is a seventh N-type metal-oxide-semiconductor field-effect transistor, a source of the seventh P-type metal-oxide-semiconductor field-effect transistor is coupled to the power source voltage, a source of the seventh N-type metal-oxide-semiconductor field-effect transistor is coupled to the ground voltage, a drain of the seventh P-type metal-oxide-semiconductor field-effect transistor and a drain of the seventh N-type metal-oxide-semiconductor field-effect transistor are respectively coupled to the second sub-node, and a gate of the seventh P-type metal-oxide-semiconductor field-effect transistor and a gate of the seventh N-type metal-oxide-semiconductor field-effect transistor are respectively coupled to the data output ends of the plurality of flip-flops for receiving the second data signal.

12. The multi-bit flip-flop as claimed in claim 11, wherein the pull-up transistor and the pull-down transistor constitute a feedback inverter, and the feedback inverter is configured as a weak keeper circuit compared to the third inverter.

13. A multi-bit flip-flop, comprising:

a clock input pin, configured to receive a first clock signal;

a clock buffer circuit, coupled to the clock input pin, and used to receive the first clock signal and provide a second clock signal and a third clock signal according to the first clock signal, wherein the clock buffer circuit comprises:

a first inverter, coupled to the clock input pin via a first node, and used to receive and invert the first clock signal and output the inverted first clock signal as a fourth clock signal via a second node;

a second inverter, coupled to the second node via a third node, and used to receive and invert the fourth clock signal and output the inverted fourth clock signal as a fifth clock signal via a fourth node;

a transistor string, coupled to the third node and the fourth node, and used to receive the fourth clock signal and the fifth clock signal and provide the second clock signal and the third clock signal via a fifth node and a sixth node according to the fourth clock signal and the fifth clock signal; and a plurality of flip-flops, wherein each of the plurality of flip-flops has a data input end and a data output end corresponding to each other, and each of the plurality of flip-flops is coupled to the fifth node and the sixth node, and used to receive the second clock signal and the third clock signal, and stores data according to the second clock signal and the third clock signal.

14. The multi-bit flip-flop as claimed in claim 13, wherein the first inverter includes a first P-type metal-oxide-semiconductor field-effect transistor and a first N-type metal-oxide-semiconductor field-effect transistor connected in series with each other, a source of the first P-type metal-oxide-semiconductor field-effect transistor is coupled to a power source voltage, a source of the first N-type metal-oxide-semiconductor field-effect transistor is coupled to a ground voltage, a drain of the first P-type metal-oxide-semiconductor field-effect transistor and a drain of the first N-type metal-oxide-semiconductor field-effect transistor are commonly coupled to the second node, and a gate of the first P-type metal-oxide-semiconductor field-effect transistor and a gate of the first N-type metal-oxide-semiconductor field-effect transistor are commonly coupled to the first node.

15. The multi-bit flip-flop as claimed in claim 14, wherein the second inverter includes a second P-type metal-oxide-semiconductor field-effect transistor and a second N-type metal-oxide-semiconductor field-effect transistor connected in series with each other, a source of the second P-type metal-oxide-semiconductor field-effect transistor is coupled to the power source voltage, a source of the second N-type metal-oxide-semiconductor field-effect transistor is coupled to the ground voltage, a drain of the second P-type metal-oxide-semiconductor field-effect transistor and a drain of the second N-type metal-oxide-semiconductor field-effect transistor are commonly coupled to the fourth node, and a gate of the second P-type metal-oxide-semiconductor field-effect transistor and a gate of the second N-type metal-oxide-semiconductor field-effect transistor are commonly coupled to the third node.

16. The multi-bit flip-flop as claimed in claim 15, wherein the transistor string includes a third P-type metal-oxide-semiconductor field-effect transistor, a third N-type metal-oxide-semiconductor field-effect transistor and a fourth N-type metal-oxide-semiconductor field-effect transistor connected in series with each other, wherein a source of the third P-type metal-oxide-semiconductor field-effect transistor is coupled to the power source voltage, a drain of the third P-type metal-oxide-semiconductor field-effect transistor and a drain of the third N-type metal-oxide-semiconductor field-effect transistor are commonly coupled to the fifth node, a source of the third N-type metal-oxide-semiconductor field-effect transistor and a drain of the fourth N-type metal-oxide-semiconductor field-effect transistor are commonly coupled to the sixth node, a source of the fourth N-type metal-oxide-semiconductor field-effect transistor is coupled to the ground voltage, a gate of the third P-type metal-oxide-semiconductor field-effect transistor and a gate of the third N-type metal-oxide-semiconductor field-effect transistor are commonly coupled to the third node, a gate of the fourth N-type metal-oxide-semiconductor field-effect transistor is coupled to the fourth node.

17. The multi-bit flip-flop as claimed in claim 16, wherein the clock buffer circuit further comprises:

a fourth P-type metal-oxide-semiconductor field-effect transistor, wherein a source of the fourth P-type metal-oxide-semiconductor field-effect transistor is coupled to the fifth node, a drain of the fourth P-type metal-oxide-semiconductor field-effect transistor is coupled to the sixth node, a gate of the fourth P-type metal-oxide-semiconductor field-effect transistor and the gate of the fourth N-type metal-oxide-semiconductor field-effect transistor are commonly coupled to the fourth node;

a first capacitor, wherein a first end of the first capacitor is coupled to the power source voltage, and a second end of the first capacitor is coupled to the fifth node; and a second capacitor, wherein a first end of the second capacitor is coupled to the ground voltage, and a second end of the second capacitor is coupled to the sixth node.

18. An electronic device, comprising:
a multi-bit flip-flop including:
a clock input pin, configured to receive a first clock signal;
a clock buffer circuit, coupled to the clock input pin, and used to receive the first clock signal and provide a second clock signal and a third clock signal according to the first clock signal, wherein the clock buffer circuit comprises:
a first inverter, coupled to the clock input pin via a first node, and used to receive and invert the first clock signal and output the inverted first clock signal as the second clock signal via a second node; and
a second inverter, coupled to the second node via a third node, and used to receive and invert the second clock signal and output the inverted second clock signal as the third clock signal via a fourth node; and
a plurality of flip-flops, wherein each of the plurality of flip-flops has a data input end and a data output end corresponding to each other, and each of the plurality of flip-flops is coupled to the third node and the fourth node, and used to receive the second clock signal and the third clock signal and store data according to the second clock signal and the third clock signal;
wherein the clock buffer circuit is further used to provide a first power switch signal and a second power switch signal via a fifth node and a sixth node according to the second clock signal and the third clock signal, and each of the plurality of flip-flops is further coupled to the fifth node and the sixth node and used to receive the first power switch signal and the second power switch signal.

19. The electronic device as claimed in claim 18, wherein the first inverter comprises a first P-type metal-oxide-semiconductor field-effect transistor (PMOSFET) and a first N-type metal-oxide-semiconductor field-effect transistor (NMOSFET) connected in series with each other, wherein a source of the first P-type metal-oxide-semiconductor field-effect transistor is coupled to a power source voltage, a source of the first N-type metal-oxide-semiconductor field-effect transistor is coupled to a ground voltage, a drain of the first P-type metal-oxide-semiconductor field-effect transistor and a drain of the first N-type metal-oxide-semiconductor field-effect transistor are commonly coupled to the second node, and a gate of the first P-type metal-oxide-semiconductor field-effect transistor and a gate of the first N-type metal-oxide-semiconductor field-effect transistor are commonly coupled to the first node.

20. The electronic device as claimed in claim 19, wherein the second inverter comprises a second P-type metal-oxide-semiconductor field-effect transistor and a second N-type metal-oxide-semiconductor field-effect transistor connected in series with each other, wherein a source of the second P-type metal-oxide-semiconductor field-effect transistor is coupled to the power source voltage, a source of the second N-type metal-oxide-semiconductor field-effect transistor is coupled to the ground voltage, a drain of the second P-type metal-oxide-semiconductor field-effect transistor and a drain of the second N-type metal-oxide-semiconductor field-effect transistor are commonly coupled to the fourth node, and a gate of the second P-type metal-oxide-semiconductor field-effect transistor and a gate of the second N-type metal-oxide-semiconductor field-effect transistor are commonly coupled to the third node.

21. The electronic device as claimed in claim 20, wherein the clock buffer circuit further comprises:
  a third P-type metal-oxide-semiconductor field-effect transistor, connected in series between the first P-type metal-oxide-semiconductor field-effect transistor and the power source voltage, wherein a source of the third P-type metal-oxide-semiconductor field-effect transistor is coupled to the power source voltage, and a drain and a gate of the third P-type metal-oxide-semiconductor field-effect transistor are commonly coupled to the source of the first P-type metal-oxide-semiconductor field-effect transistor; and
  a third N-type metal-oxide-semiconductor field-effect transistor, connected in series between the second N-type metal-oxide-semiconductor field-effect transistor and the ground voltage, wherein a source of the third N-type metal-oxide-semiconductor field-effect transistor is coupled to the ground voltage, and a drain and a gate of the third N-type metal-oxide-semiconductor field-effect transistor are commonly coupled to the source of the second N-type metal-oxide-semiconductor field-effect transistor.

22. The electronic device as claimed in claim 20, wherein the clock buffer circuit further comprises:
  a third P-type metal-oxide-semiconductor field-effect transistor, wherein a source of the third P-type metal-oxide-semiconductor field-effect transistor is coupled to the power source voltage, a drain of the third P-type metal-oxide-semiconductor field-effect transistor is coupled to the fifth node, and a gate of the third P-type metal-oxide-semiconductor field-effect transistor and the plurality of flip-flops are commonly coupled to the third node;
  a third N-type metal-oxide-semiconductor field-effect transistor, wherein a source of the third N-type metal-oxide-semiconductor field-effect transistor is coupled to the fifth node, a drain of the third N-type metal-oxide-semiconductor field-effect transistor is coupled to the power source voltage, and a gate of the third N-type metal-oxide-semiconductor field-effect transistor and the gate of the third P-type metal-oxide-semiconductor field-effect transistor are commonly coupled to the third node;
  a fourth P-type metal-oxide-semiconductor field-effect transistor, wherein a source of the fourth P-type metal-oxide-semiconductor field-effect transistor is coupled to the sixth node, a drain of the fourth P-type metal-oxide-semiconductor field-effect transistor is coupled to the ground voltage, and a gate of the fourth P-type metal-oxide-semiconductor field-effect transistor and the plurality of flip-flops are commonly coupled to the fourth node; and
  a fourth N-type metal-oxide-semiconductor field-effect transistor, wherein a source of the fourth N-type metal-oxide-semiconductor field-effect transistor is coupled to the ground voltage, a drain of the fourth N-type metal-oxide-semiconductor field-effect transistor being coupled to the sixth node, and a gate of the fourth N-type metal-oxide-semiconductor field-effect transistor and the gate of the fourth P-type metal-oxide-semiconductor field-effect transistor being commonly coupled to the fourth node.

23. The electronic device as claimed in claim 22, wherein the clock buffer circuit further comprises:
  a third P-type metal-oxide-semiconductor field-effect transistor, wherein a source of the third P-type metal-oxide-semiconductor field-effect transistor is coupled to the power source voltage, a drain of the third P-type metal-oxide-semiconductor field-effect transistor is coupled to the fifth node, and a gate of the third P-type metal-oxide-semiconductor field-effect transistor and the plurality of flip-flops are commonly coupled to the third node;
  a fourth and a fifth P-type metal-oxide-semiconductor field-effect transistors, wherein a source of the fourth P-type metal-oxide-semiconductor field-effect transistor is coupled to the power source voltage, a drain and a gate of the fourth P-type metal-oxide-semiconductor field-effect transistor are commonly coupled to a source of the fifth P-type metal-oxide-semiconductor field-effect transistor, a drain of the fifth P-type metal-oxide-semiconductor field-effect transistor is coupled to the fifth node, and a gate of the fifth P-type metal-oxide-semiconductor field-effect transistor and the plurality of flip-flops are commonly coupled to the fourth node;
  a third N-type metal-oxide-semiconductor field-effect transistor, wherein a source of the third N-type metal-oxide-semiconductor field-effect transistor is coupled to the ground voltage, a drain of the third N-type metal-oxide-semiconductor field-effect transistor is coupled to the sixth node, and a gate of the third N-type metal-oxide-semiconductor field-effect transistor and the plurality of flip-flops are commonly coupled to the fourth node; and
  a fourth and a fifth N-type metal-oxide-semiconductor field-effect transistors, wherein a source of the fourth N-type metal-oxide-semiconductor field-effect transistor is coupled to the ground voltage, a drain and a gate of the fourth N-type metal-oxide-semiconductor field-effect transistor are commonly coupled to a source of the fifth N-type metal-oxide-semiconductor field-effect transistor, a drain of the fifth N-type metal-oxide-semiconductor field-effect transistor is coupled to the sixth node, and a gate of the fifth N-type metal-oxide-semiconductor field-effect transistor and the plurality of flip-flops are commonly coupled to the third node.

24. The electronic device as claimed in claim 20, wherein each of the plurality of flip-flops is a dynamic flip-flop and comprises:

a transmission gate, coupled to the data input end of the flip-flop, and used to receive a first data signal and output the first data signal to a first sub-node according to the second clock signal and the third clock signal;

a third inverter, coupled to the transmission gate via the first sub-node, and used to invert the first data signal and output the inverted first data signal to a second sub-node;

a fourth inverter, coupled between the second sub-node and the data output end of the flip-flop, and used to invert the inverted first data signal to generate a second data signal and output the second data signal to the output end of the flip-flop;

a pull-up transistor, coupled between the second sub-node and the power source voltage, and used to pull up a voltage of the second sub-node to the power source voltage; and a pull-down transistor, coupled between the second sub-node and the ground voltage, and used to pull down the voltage of the second sub-node to the ground voltage.

25. The electronic device as claimed in claim 24, wherein the transmission gate comprises a third N-type metal-oxide-semiconductor field-effect transistor and a third P-type metal-oxide-semiconductor field-effect transistor connected in parallel with each other, a drain of the third N-type metal-oxide-semiconductor field-effect transistor and a drain of the third P-type metal-oxide-semiconductor field-effect transistor are commonly coupled to the data input end of the flip-flop via a third sub-node, a source of the third N-type metal-oxide-semiconductor field-effect transistor and a source of the third P-type metal-oxide-semiconductor field-effect transistor are commonly coupled to the first sub-node via a fourth sub-node, a gate of the third N-type metal-oxide-semiconductor field-effect transistor is used to receive the second clock signal, and a gate of the third P-type metal-oxide-semiconductor field-effect transistor is used to receive the third clock signal.

26. The electronic device as claimed in claim 25, wherein the third inverter is a tri-state inverter and comprises a fourth P-type metal-oxide-semiconductor field-effect transistor, a fifth P-type metal-oxide-semiconductor field-effect transistor, a fourth N-type metal-oxide-semiconductor field-effect transistor and a fifth N-type metal-oxide-semiconductor field-effect transistor connected in series with each other, a source of the fourth P-type metal-oxide-semiconductor field-effect transistor is coupled to the power source voltage, a source of the fifth N-type metal-oxide-semiconductor field-effect transistor is coupled to the ground voltage, a gate of the fourth P-type metal-oxide-semiconductor field-effect transistor and a gate of the fifth N-type metal-oxide-semiconductor field-effect transistor are respectively coupled to the first sub-node for receiving the first data signal, a source of the fifth P-type metal-oxide-semiconductor field-effect transistor is coupled to a drain of the fourth P-type metal-oxide-semiconductor field-effect transistor, a source of the fourth N-type metal-oxide-semiconductor field-effect transistor is coupled to a drain of the fifth N-type metal-oxide-semiconductor field-effect transistor, a drain of the fifth P-type metal-oxide-semiconductor field-effect transistor and a drain of the fourth N-type metal-oxide-semiconductor field-effect transistor are commonly coupled to the second sub-node via a fifth sub-node, a gate of the fifth P-type metal-oxide-semiconductor field-effect transistor is used to receive the second clock signal, and a gate of the fourth N-type metal-oxide-semiconductor field-effect transistor is used to receive the third clock signal.

27. The electronic device as claimed in claim 26, wherein the fourth inverter comprises a sixth P-type metal-oxide-semiconductor field-effect transistor and a sixth N-type metal-oxide-semiconductor field-effect transistor connected in series with each other, a source of the sixth P-type metal-oxide-semiconductor field-effect transistor is coupled to the power source voltage, a source of the sixth N-type metal-oxide-semiconductor field-effect transistor is coupled to the ground voltage, a drain of the sixth P-type metal-oxide-semiconductor field-effect transistor and a drain of the sixth N-type metal-oxide-semiconductor field-effect transistor are commonly coupled to the data output end of the flip-flop via a sixth sub-node, and a gate of the sixth P-type metal-oxide-semiconductor field-effect transistor and a gate of the sixth N-type metal-oxide-semiconductor field-effect transistor are commonly coupled to the second sub-node via a seventh sub-node for receiving the inverted first data signal.

28. The electronic device as claimed in claim 27, wherein the pull-up transistor is a seventh P-type metal-oxide-semiconductor field-effect transistor, the pull-down transistor is a seventh N-type metal-oxide-semiconductor field-effect transistor, a source of the seventh P-type metal-oxide-semiconductor field-effect transistor is coupled to the power source voltage, a source of the seventh N-type metal-oxide-semiconductor field-effect transistor is coupled to the ground voltage, a drain of the seventh P-type metal-oxide-semiconductor field-effect transistor and a drain of the seventh N-type metal-oxide-semiconductor field-effect transistor are respectively coupled to the second sub-node, and a gate of the seventh P-type metal-oxide-semiconductor field-effect transistor and a gate of the seventh N-type metal-oxide-semiconductor field-effect transistor are respectively coupled to the data output ends of the plurality of flip-flops for receiving the second data signal.

29. The electronic device as claimed in claim 28, wherein the pull-up transistor and the pull-down transistor constitute a feedback inverter, and the feedback inverter is configured as a weak keeper circuit compared to the third inverter.

30. An electronic device, comprising:
a multi-bit flip-flop, including:
a clock input pin, configured to receive a first clock signal;
a clock buffer circuit, coupled to the clock input pin, and used to receive the first clock signal and provide a second clock signal and a third clock signal according to the first clock signal, wherein the clock buffer circuit comprises:
a first inverter, coupled to the clock input pin via a first node, and used to receive and invert the first clock signal and output the inverted first clock signal as a fourth clock signal via a second node;
a second inverter, coupled to the second node via a third node, and used to receive and invert the fourth clock signal and output the inverted fourth clock signal as a fifth clock signal via a fourth node; and
a transistor string, coupled to the third node and the fourth node, and used to receive the fourth clock signal and the fifth clock signal and provide the second clock signal and the third clock signal via a fifth node and a sixth node according to the fourth clock signal and the fifth clock signal; and
a plurality of flip-flops, wherein each of the plurality of flip-flops has a data input end and a data output end corresponding to each other, and each of the plurality of flip-flops is coupled to the fifth node and the sixth node, and used to receive the second clock signal and the third clock signal, and stores data according to the second clock signal and the third clock signal.

31. The electronic device as claimed in claim 30, wherein the first inverter includes a first P-type metal-oxide-semiconductor field-effect transistor and a first N-type metal-oxide-semiconductor field-effect transistor connected in series with each other, a source of the first P-type metal-oxide-semiconductor field-effect transistor is coupled to a power source voltage, a source of the first N-type metal-oxide-semiconductor field-effect transistor is coupled to a ground voltage, a drain of the first P-type metal-oxide-semiconductor field-effect transistor and a drain of the first N-type metal-oxide-semiconductor field-effect transistor are commonly coupled to the second node, and a gate of the first P-type metal-oxide-semiconductor field-effect transistor and a gate of the first N-type metal-oxide-semiconductor field-effect transistor are commonly coupled to the first node.

32. The electronic device as claimed in claim 31, wherein the second inverter includes a second P-type metal-oxide-semiconductor field-effect transistor and a second N-type metal-oxide-semiconductor field-effect transistor connected in series with each other, a source of the second P-type metal-oxide-semiconductor field-effect transistor is coupled to the power source voltage, a source of the second N-type metal-oxide-semiconductor field-effect transistor is coupled to the ground voltage, a drain of the second P-type metal-oxide-semiconductor field-effect transistor and a drain of the second N-type metal-oxide-semiconductor field-effect transistor are commonly coupled to the fourth node, and a gate of the second P-type metal-oxide-semiconductor field-effect transistor and a gate of the second N-type metal-oxide-semiconductor field-effect transistor are commonly coupled to the third node.

33. The electronic device as claimed in claim 32, wherein the transistor string includes a third P-type metal-oxide-semiconductor field-effect transistor, a third N-type metal-oxide-semiconductor field-effect transistor and a fourth N-type metal-oxide-semiconductor field-effect transistor connected in series with each other, wherein a source of the third P-type metal-oxide-semiconductor field-effect transistor is coupled to the power source voltage, a drain of the third P-type metal-oxide-semiconductor field-effect transistor and a drain of the third N-type metal-oxide-semiconductor field-effect transistor are commonly coupled to the fifth node, a source of the third N-type metal-oxide-semiconductor field-effect transistor and a drain of the fourth N-type metal-oxide-semiconductor field-effect transistor are commonly coupled to the sixth node, a source of the fourth N-type metal-oxide-semiconductor field-effect transistor is coupled to the ground voltage, a gate of the third P-type metal-oxide-semiconductor field-effect transistor and a gate of the third N-type metal-oxide-semiconductor field-effect transistor are commonly coupled to the third node, a gate of the fourth N-type metal-oxide-semiconductor field-effect transistor is coupled to the fourth node.

34. The electronic device as claimed in claim 33, wherein the clock buffer circuit further comprises:
- a fourth P-type metal-oxide-semiconductor field-effect transistor, wherein a source of the fourth P-type metal-oxide-semiconductor field-effect transistor is coupled to the fifth node, a drain of the fourth P-type metal-oxide-semiconductor field-effect transistor is coupled to the sixth node, a gate of the fourth P-type metal-oxide-semiconductor field-effect transistor and the gate of the fourth N-type metal-oxide-semiconductor field-effect transistor are commonly coupled to the fourth node;
- a first capacitor, wherein a first end of the first capacitor is coupled to the power source voltage, and a second end of the first capacitor is coupled to the fifth node; and
- a second capacitor, wherein a first end of the second capacitor is coupled to the ground voltage, and a second end of the second capacitor is coupled to the sixth node.

* * * * *